United States Patent [19]
Avanzino et al.

[11] Patent Number: 6,121,150
[45] Date of Patent: Sep. 19, 2000

[54] SPUTTER-RESISTANT HARDMASK FOR DAMASCENE TRENCH/VIA FORMATION

[75] Inventors: Steven C. Avanzino, Cupertino; Fei Wang, San Jose, both of Calif.

[73] Assignee: Advanced Micro Devices, Inc., Sunnyvale, Calif.

[21] Appl. No.: 09/296,557

[22] Filed: Apr. 22, 1999

[51] Int. Cl.[7] ..................................................... H01L 21/00
[52] U.S. Cl. .............................. 438/692; 216/38; 216/88; 438/723; 438/734; 438/743
[58] Field of Search ........................................ 438/626, 633, 438/640, 644, 645, 672, 673, 706, 712, 713, 723, 734, 743, 745, 756, 749, 754; 216/18, 38, 65, 67, 79, 88, 99

[56] References Cited

U.S. PATENT DOCUMENTS

| | | | |
|---|---|---|---|
| 5,578,523 | 11/1996 | Fiordalice et al. | 438/692 X |
| 5,968,847 | 10/1999 | Ye et al. | 438/734 |
| 6,017,821 | 1/2000 | Yang et al. | 438/692 |

*Primary Examiner*—William Powell

[57] ABSTRACT

The dimensional precision and accuracy of sub-micron-sized, in-laid metallization patterns, e.g., of electroplated copper or copper alloy, formed in the surface of a dielectric layer are significantly improved by utilizing a layer of a sputter-resistant mask material formed of a high atomic mass metallic element or compound thereof during reactive ion etching of the dielectric layer by a fluorine-containing plasma for forming sub-micron-dimensioned recesses therein. After filling of the recesses, planarization, as by CMP, is conducted wherein excess thickness of the metal layer is removed, together with underlying portions of the sputter-resistant mask layer.

20 Claims, 3 Drawing Sheets

↓ ELECTROPLATE Cu

↓ CMP Cu

SPUTTER-RESISTANT HARDMASK FOR DAMASCENE TRENCH/VIA FORMATION

FIELD OF THE INVENTION

The present invention relates to a method for forming a layer of an electrically conductive material filling a plurality of spaced apart recesses formed in the surface of a substrate, wherein the exposed upper surface of the layer is substantially coplanar with non-recessed areas of the substrate surface. More particularly, the invention relates to a method for performing "back-end" metallization of semiconductor high-speed integrated circuit devices having sub-micron dimensioned design features and high conductivity interconnect features, which method facilitates formation of recesses of desired submicron-dimensioned feature sizes in a dielectric layer formed over a semiconductor substrate, which recesses are subsequently blanket-deposited with a layer of conductor metal, followed by planarization of the metallized surface, as by chemical-mechanical polishing (CMP).

BACKGROUND OF THE INVENTION

The present invention relates to metallization processing for integrated circuit semiconductor device and circuit board manufacture, and is especially adapted for use in processing employing "damascene" (or "in-laid") technology.

The escalating requirements for high density and performance associated with ultra large scale integration (ULSI) semiconductor device wiring are difficult to satisfy in terms of providing submicron-sized (e.g., 0.18 $\mu$m and below, such as 0.15 $\mu$m and below), low resistance-capacitance (RC) time constant metallization patterns, particularly wherein the submicron-sized metallization features such as vias, contact areas, grooves, trenches, etc., have high aspect (i.e., depth-to-width) ratios due to microminiaturization.

Semiconductor devices of the type contemplated herein typically comprise a semiconductor wafer substrate, usually of doped monocrystalline silicon, and a plurality of sequentially formed inter-layer dielectrics and conductive patterns formed therein and/or therebetween. An integrated circuit is formed therefrom containing a plurality of patterns of conductive lines separated by interwiring spacings, and a plurality of interconnect lines, such as bus lines, bit lines, word lines, and logic interconnect lines. Typically, the conductive patterns of vertically spaced apart metallization layers are electrically connected by a vertically oriented conductive plug filling a via hole formed in the dielectric layer separating the layers, while another conductive plug filling a contact area hole establishes electrical contact with an active region, such as a source/drain region, formed in or on the semiconductor substrate. Conductive lines formed in groove or trench-like openings in overlying dielectric layers extend substantially parallel to the semiconductor substrate. Semiconductor devices of such type fabricated according to current technology may comprise five or more layers of such metallization in order to satisfy device geometry and miniaturization requirements.

Electrically conductive films or layers of the type contemplated herein for use in e.g., "back-end" semiconductor manufacturing technology as required for fabrication of devices as above described typically comprise a metal such as titanium, tantalum, tungsten, aluminum, chromium, nickel, cobalt, silver, gold, copper, and their alloys. In use, each of the recited metals presents advantages as well as drawbacks. For example, aluminum (Al) is relatively inexpensive, exhibits low resistivity, and is relatively easy to etch. However, in addition to being difficult to deposit by lower cost, lower temperature, more rapid "wet" technology such as electrodeposition, step coverage with Al is poor when the metallization features are scaled down to sub-micron size, resulting in decreased reliability of interconnections, high current densities at certain locations, and increased electromigration. In addition, low dielectric constant materials, e.g., polyimides, when employed as inter-layer dielectrics, create moisture/bias reliability problems when in contact with Al.

The use of via plugs filled with tungsten (W) may alleviate several problems associated with Al. However, most W-based processes are complex and expensive. In addition, the high resistivity of W may cause Joule heating which can undesirably enhance electromigration of Al in adjacent wiring. Moreover, W plugs are susceptible to void formation and high contact resistance at the interface with the Al wiring layer.

Copper (Cu) and Cu-based alloys are particularly attractive, as for use in ULSI devices requiring multilevel metallization systems for "back-end" processing of the semiconductor wafers. Cu and Cu-based metallization systems have very low resistivities, i.e., significantly lower than that of W and even lower than those of previously preferred systems utilizing Al and its alloys, as well as significantly higher resistance to electromigration. Moreover, Cu and its alloys enjoy a considerable cost advantage over a number of the above-enumerated metals, notably silver and gold. Also, in contrast to Al and the refractory-type metals, Cu and its alloys can be readily deposited at low temperatures in good quality, bright layer form by well-known electroplating techniques, at deposition rates fully compatible with the requirements of device manufacturing throughput.

In addition to convenient, relatively low cost, low temperature, high throughput "wet" deposition by electroplating, Cu and its alloys are readily amenable to low cost, high throughput electroless deposition of high quality films for efficiently filling recesses such as vias, contact areas, and grooves and trenches forming interconnection routing. Such electroless plating generally involves the controlled autocatalytic deposition of a continuous film of Cu or an alloy thereof on a catalytic surface by the interaction of at least a Cu-containing salt and a chemical reducing agent contained in a suitable solution, whereas electroplating comprises employing electrons supplied to an electrode from an external source (i.e., a power supply) for reducing Cu ions in solution and depositing reduced metal atoms on the surface thereof. In either case, a nucleation/seed layer is required for catalysis and/or deposition on the types of substrates contemplated for use herein. Finally, while electroplating requires a continuous nucleation/seed layer, very thin and discontinuous islands of a catalytic metal may be employed with electroless plating.

As indicated above, a commonly employed method for forming "in-laid" metallization patterns such as are required for "back-end" metallization processing of semiconductor wafers employs "damascene" type technology. Generally, in such processing methodology, a recess (i.e., an opening) for forming, e.g., a via hole in an inter-layer dielectric for electrically connecting vertically separated metallization layers, is created in the inter-layer dielectric by conventional photolithographic and etching techniques, and filled with a metal plug, typically of W. Any excess conductive material (i.e., W) on the surface of the dielectric interlayer is then removed by, e.g., chemical-mechanical polishing techniques (CMP), wherein a moving pad is biased against the surface to be polished, with the interposition of a slurry containing abrasive particles (and other ingredients) therebetween. A variant of the above-described technique, termed "dual damascene" processing, involves the formation of an opening comprising a lower contact or via hole section in communication with an upper groove or trench section, which opening is filled with a conductive material, typically a metal, to simultaneously form a conductive plug in electrical contact with a conductive line.

Referring now to FIG. 1, schematically shown therein in simplified cross-sectional view is a conventional damascene processing sequence employing relatively low cost, high manufacturing throughput electroplating and CMP techniques for forming recessed "back-end" metallization patterns (illustratively of Cu-based metallurgy but not limited thereto) in a semiconductor device formed in or on a semiconductor wafer substrate 1. In a first step, the desired arrangement of conductors is defined as a pattern of recesses 2 such as via holes, grooves, trenches, etc., formed (as by conventional photolithographic and etching techniques) in the surface 4 of a dielectric layer 3 (e.g., a silicon oxide and/or nitride or an organic polymeric material) deposited or otherwise formed over the semiconductor substrate 1. In a second step, a layer of Cu or Cu-based alloy 5 is deposited by conventional electroplating techniques to fill the recesses 2. In order to ensure complete filling of the recesses, the Cu-containing layer is deposited as a blanket (or "overburden") layer of excess thickness t so as to overfill the recesses 2 and cover the upper surface 4 of the dielectric layer 3. Next, the entire excess thickness t of the metal overburden layer 5 over the surface 4 of the dielectric layer 3 is removed by a CMP process utilizing an alumina-based slurry, leaving metal portions 5' in the recesses 2 with their exposed upper surfaces 6 substantially coplanar with the surface 4 of the dielectric layer 3.

The above-described conventional damascene process forms in-laid conductors 5' in the dielectric layer 3 while avoiding problems associated with other types of metallization patterning processing, e.g., blanket metal layer deposition, followed by photolithographic masking/etching and dielectric gap filling. In addition, such single or dual damascene-type processing can be performed with a variety of other types of substrates, e.g., printed circuit boards, with and/or without intervening dielectric layers, and with a plurality of metallization levels, i.e., five or more levels.

However, the use of electroplated metallization as described above has presented a number of problems, particularly, but not exclusively, with the use of Cu-based metallurgy. For example, although electroplating of Cu (a "wet" technique) has advantages over "dry" techniques (e.g., physical or chemical vapor deposition), such as rapid rates of deposition at low temperatures and good compatibility with "wet" CMP processing, it suffers from a drawback of ridge build-up over sharp corners of vias, grooves, and trenches. Thus, in conventional practices utilizing electrolytic deposition of Cu or Cu-based alloy conductors, a rather thick blanket or overburden layer 5, typically about 0.5–1.5 $\mu$m thick, must be deposited over the recess-patterned surface to ensure complete filling (i.e., overfilling) of recesses 2 such as via holes, trenches, grooves, and other variously configured openings. Moreover, the resulting surface after overfilling may be highly non-planar, with the layer thicknesses thereof spanning the entire range of thicknesses given above.

Removal of such thick, non-planar blanket layers of Cu-based material in the subsequent CMP step for planarizing the interconnection metallization entails a number of disadvantages. For example, removal of the excess Cu-based material by CMP is slow and expensive. Specifically, typical Cu or Cu-based alloy removal rates by CMP employing a conventional alumina-based slurry are on the order of about 2,000–3,000 Å/min. Consequently, removal of 0.5–1.5 $\mu$m thick Cu-based layers can require long processing times extending up to about 5 minutes, considerably longer than that desired for good manufacturing throughput and reduced expense. In addition, removal of such thick as-deposited Cu or Cu-based alloy blanket or overburden layers by CMP results in less uniform polished layers as are obtained when CMP is performed on thinner deposited layers. Such poor uniformity is generally accompanied by an increase in defects such as non-planarity ("dishing") and gouging ("erosion") between adjacent metallization lines.

A further drawback associated with Cu-based "back-end" metallization is the possibility of Cu diffusion into the underlying semiconductor, typically silicon, resulting in degradation of the semiconductive properties thereof, as well as poor adhesion of the deposited Cu or Cu-based alloy layer to various materials employed as inter-layer dielectrics, etc. As a consequence of these phenomena associated with Cu-based metallurgy, it is generally necessary to provide an adhesion promoting and/or diffusion barrier layer intermediate to the semiconductor substrate and the overlying Cu-based metallization layer. Suitable materials for such adhesion/barrier layers include, e.g., chromium (Cr), tantalum (Ta), and tantalum nitride (TaN).

Yet another drawback associated with the use of electroplated Cu or Cu-based alloy damascene type metallization arises from incomplete filling of the recesses during the electroplating process, resulting in void and/or other defect formation causing a reduction in device quality. While the exact mechanism of such void formation due to premature occlusion or "pinching-off" of recesses at the upper, or mouth portions thereof is not known with certainty, it is believed to result from formation of overhanging portions of the adhesion/barrier and/or nucleation/seed layers at the upper corners of the recesses during the physical vapor deposition (PVD) processing utilized for their deposition, as well as from increased rates of Cu electroplating at the corners of the adhesion/barrier and/or nucleation/seed layers. It is further believed that such increased rates of deposition at the corners are related to the formation of higher electric fields thereat during application of the electrical potentials necessary for effecting electroplating thereon.

A still further drawback attendant upon the use of damascene technology for forming sub-micron dimensioned in-laid metallization patterns and features arises from the loss of critical dimension (CD) of the hardmask utilized in the step for forming the pattern of recesses in the dielectric layer according to conventional reactive ion etching processing for obtaining the requisite anisotropic etching of the dielectric layer, resulting in an undesirable increase in recess opening and other feature dimensions. Adverting to FIGS. 2(A)–2(C), shown therein in simplified, cross-sectional schematic form, are views successively illustrating initial, intermediate, and final stages of a conventional reactive ion etching process for forming sub-micron-dimensioned recesses in a dielectric layer, utilizing a silicon nitride hard mask.

Referring more particularly to FIG. 2(A), in a first step, a layer 7 of silicon nitride hardmask material is formed over the exposed upper surface 4 of dielectric layer 3 formed on the upper surface of substrate 1, typically a semiconductor wafer comprising at least one active device region formed therein or thereon and patterned, as by conventional photolithographic masking and etching techniques employing a layer of photoresist material, to form a sub-micron-dimensioned mask opening 8 therein having a critical dimension CD. The substrate having the patterned mask thereon is then subjected to conventional reactive ion etching, typically selected from DC, RF, and directed beam reactive ion etching utilizing a fluorine-containing plasma, for forming a recess 2 in the surface 4 of dielectric layer 3. FIG. 2(B) illustrates the etch profiles approximately halfway through the etching process. As shown therein, relatively small portions 7' (represented by dashed lines in the figure) of the silicon nitride hardmask layer 7 bordering mask opening 8 have been lost (i.e., consumed) due to sputtering therefrom which is incidental to the reactive ion etching process, and, as a consequence, sidewalls 2' of recess 2 have begun to exhibit slight to moderate inwardly tapering, i.e., a small deviation from perpendicularity with upper surface 4 of dielectric layer 3. However, at the completion of the etching process, as shown in FIG. 2(C), relatively large portions 7" (again represented by dashed lines in the figure) have been lost or consumed due to sputtering therefrom and the inward tapering of recess sidewalls 2' is substantial, resulting in significant loss in CD and undesirable increase in recess dimensions, particularly at the mouth portion thereof adjacent upper surface 4 of dielectric layer 3. Thus, it is apparent that the CD cannot be adequately maintained during recess formation according to the conventional reactive ion etching processing. In addition to the loss of CD, the use of a high dielectric constant hardmask material (e.g., silicon nitride) can undesirably add to device capacitance if it is allowed to remain on the wafer as a "sandwich" dielectric. As a consequence, an additional processing step, e.g., plasma etching, may be required to remove such hardmask material prior to filling the recesses with conductive material, as by electroplating.

As design rules extend further into the submicron range, e.g., about 0.18 $\mu$m and below, such as 0.15 $\mu$m and below, and the number of metallization levels increases, maintenance of the critical feature sizes or dimensions of the metallization/interconnect pattern becomes increasingly important. Accordingly, the problem of increased feature size resulting from undesired coincidental sputtering of the hardmask causing loss of the CD during recess formation in the dielectric layer requires resolution.

Thus, there exists a need for metallization methodology enabling the formation of submicron-dimensioned metal contact and interconnect members, particularly of Cu or Cu-based alloys, having desired feature sizes, high reliability, high yield, and high performance. In particular, there exists a need for eliminating the problem of loss of CD during formation of sub-micron-dimensioned recesses which are subsequently filled by conventional electroplating techniques.

The present invention addresses and solves the problems attendant upon conventional processes for manufacturing semiconductor devices utilizing electroplated Cu or Cu-based alloy metallization, particularly in the formation of in-laid "back-end" contacts/metallization patterns by damascene techniques employing electroplating and CMP for obtaining good manufacturing throughput and product quality.

DISCLOSURE OF THE INVENTION

An advantage of the present invention is a method of manufacturing a device with a highly reliable metallization pattern at lower cost and with higher manufacturing throughput than obtainable with conventional process methodology.

Another advantage of the present invention is a method of manufacturing an integrated circuit device utilizing Cu-based "back-end" contacts and interconnections by a damascene process, with formation of highly reliable Cu or Cu alloy interconnect members having desired critical dimensions and feature sizes.

Still another advantage of the present invention is a method for forming in-laid contacts and metallization patterns by electroplating and CMP techniques at an increased speed, lower cost, and with smaller feature size, greater uniformity, planarity, and reliability than with conventional damascene type processes.

A further advantage of the present invention is an improved method for forming in-laid contacts and metallization patterns by a damascene-type electroplating and CMP-based process which is fully compatible with existing process methodology.

Additional advantages and other features of the present invention will be set forth in the description which follows and in part will become apparent to those having ordinary skill in the art upon examination of the following or may be learned from practice of the present invention. The advantages of the present invention may be realized and obtained as particularly pointed out in the appended claims.

According to one aspect of the present invention, the foregoing and other advantages are achieved in part by a method of forming a layer of an electrically conductive material filling at least one high aspect ratio recess formed in a surface of a workpiece, which method comprises the sequential steps of:

providing a workpiece having a surface;

forming a sputter-resistant hardmask layer on the workpiece surface;

forming at least one opening in the hardmask layer, the opening having a position and a critical dimension (CD) corresponding to that of said at least one high aspect ratio recess to be formed in the workpiece surface;

forming the at least one high aspect ratio recess in the workpiece surface by a reactive ion etching process utilizing the hardmask layer for determining the position and dimensions of the at least one recess, the critical opening dimension of the hardmask remaining substantially constant during the reactive ion etching process;

filling the at least one recess with a layer of an electrically conductive material, the layer of electrically conductive material overfilling the at least one recess and forming a blanket layer covering the adjacent, non-recessed portions of the workpiece surface having the hardmask layer thereon; and planarizing the recess-filled surface, the planarizing including removing the blanket layer of electrically conductive material together with the underlying hardmask layer from the non-recessed portions of the workpiece surface.

In embodiments according to the invention, the method further comprises providing a workpiece including a semiconductor wafer substrate with a dielectric layer thereon, the dielectric layer comprising the workpiece surface; forming the dielectric layer from a dielectric material selected from inorganic-based oxides, nitrides, and oxynitrides of silicon, or from an organic-based or derived low dielectric constant material selected from hydrogen silsesquioxane (HSQ), tetraethyl orthosilicate (TEOS), benzocyclobutene (BCB), parylene, and polyimide; forming the sputter-resistant hardmask layer from a high atomic mass metallic element or nitride thereof selected from Ta, W, titanium (Ti), TaN, tungsten initride (WN), and titanium nitride (TiN); forming a plurality of spaced-apart openings in the hardmask layer, each having a position and a CD corresponding to a high-aspect ratio recess to be formed in the workpiece surface, the plurality of openings in the hardmask by photolithographic masking and etching of a photoresist material; performing DC, RF, or directed beam reactive ion etching to form the at least one high aspect ratio recess in the workpiece surface; and filling the at least one recess with a layer of an electrically conductive material comprising a metal selected from Ti, Ta, W, Al, Cr, nickel (Ni), cobalt (Co), silver (Ag), gold (Au), Cu, and their alloys, preferably by depositing a layer of Cu or an alloy thereof by an electroplating or electroless plating process comprising a further step of providing at least the interior surfaces of the at least one recess with at least one of an adhesion/barrier layer comprising a material selected from Cr, Ta, and TaN and a nucleation/seed layer comprising at least one material selected from refractory metals, Cu, and Cu-based alloys prior to depositing the layer of copper or copper-based alloy by electroless or electroplating.

In further embodiments according to the invention, the recess-filled workpiece surface is planarized by CMP, as by utilizing an alumina-based slurry; and the substrate comprises a semiconductor wafer of monocrystalline silicon (Si) or gallium arsenide (GaAs) having a surface, comprising forming the dielectric layer on the wafer surface; the at least one recess comprises a plurality of recesses of different widths and/or depths for providing vias, interlevel metallization, and/or interconnection routing of at least one active device region or component of the semiconductor wafer.

Another aspect of the present invention is a method of manufacturing a semiconductor device, which method comprises the sequential steps of:

forming a dielectric layer on a surface of a semiconductor wafer substrate, the dielectric layer having an exposed surface;

forming a sputter-resistant hardmask layer on the exposed surface of the hardmask layer;

forming a plurality of spaced-apart openings in the hardmask layer, each of the plurality of openings having a position and a critical dimension corresponding to a high aspect ratio recess to be formed in the dielectric layer surface;

forming a plurality of spaced-apart, high aspect ratio recesses in the surface of the dielectric layer by a reactive ion etching process utilizing the hardmask layer for determining the positions and dimensions of the plurality of recesses, with non-recessed surface areas of the dielectric layer between adjacent recesses having the hardmask layer thereon, the critical dimension of each of the plurality of openings in the hardmask layer remaining substantially constant during the reactive ion etching;

filling the plurality of recesses with a layer of electrically conductive material by electroplating, the layer of electrically conductive material overfilling the plurality of recesses and forming a blanket layer covering the adjacent non-recessed portions of the dielectric layer surface having the hardmask layer formed thereon; and planarizing the recess-filled surface, the planarizing including removing the blanket layer of electrically conductive material together with the underlying hardmask layer from the non-recessed portions of the dielectric layer surface.

According to yet another aspect according to the present invention, integrated circuit semiconductor devices comprising in-laid, "back-end" metallization patterns including accurately-sized, sub-micron-dimensioned feature sizes formed according to the inventive method, are provided.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the embodiment of the present invention can best be understood when read in conjunction with the following drawings, in which like reference numerals are employed throughout to designate similar features, wherein.

DESCRIPTION OF THE INVENTION

Figure 1:
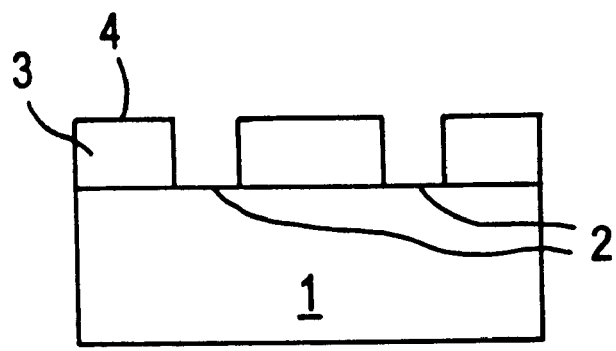
FIG. 1 illustrates, in simplified, cross-sectional schematic form, a sequence of steps for performing a damascene type copper electroplating and CMP process according to conventional practices.
Figure 1:
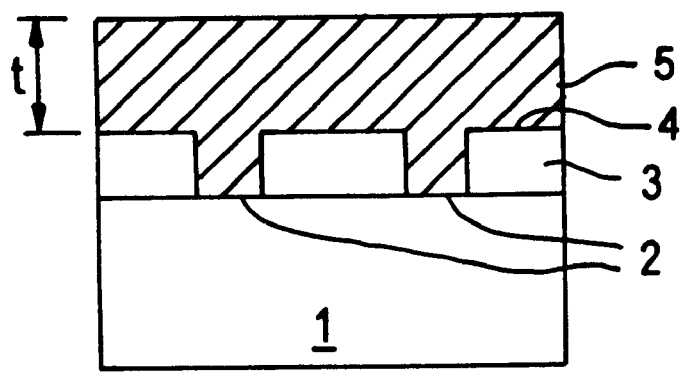
Figure 1:
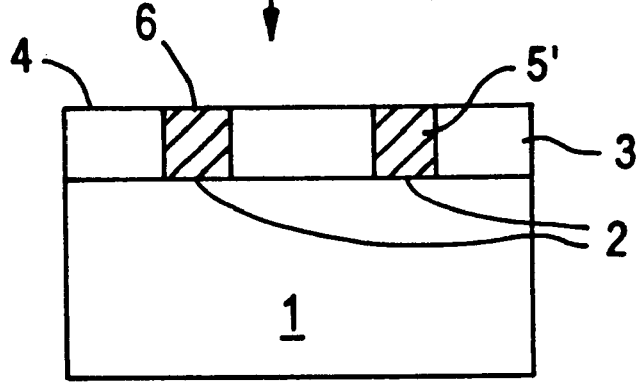

The present invention addresses and solves problems arising from manufacturing semiconductor devices comprising in-laid, "back-end" metallization patterns, wherein, as part of the fabrication methodology, a plurality of sub-micron-dimensioned recesses formed in the surface of a dielectric layer overlying a semiconductor substrate are filled with a metal, e.g., Cu or a Cu-based alloy, by an electroplating process. More specifically, the present invention advantageously enables the precise formation of sub-micron-sized recesses or openings in a dielectric layer, such as damascene openings in a silicon oxide layer, while preventing undesirable variation and increase in opening size resulting from deleterious sputtering of hardmask material defining the pattern and dimensions of the openings during reactive ion etching of the dielectric material layer for forming the recesses therein..

The present invention enables the formation of a metal, e.g., Cu or Cu-based alloy, contact and interconnect pattern with precisely sized and defined features, thereby enhancing product reliability and performance. Briefly stated, according to the present invention, the conventional hardmask material utilized for forming the recesses in the dielectric material by reactive ion etching, e.g., silicon nitride, is replaced with a sputter-resistant hardmask fabricated from a high atomic mass metallic element or nitride thereof, e.g., Ta, W, and their respective nitrides (TaN, WN). As a consequence of the reduced amount of mask sputtering which occurs coincident the reactive ion etching of the dielectric layer, the critical mask dimension (CD) is maintained, resulting in formation of precise and accurately-sized openings of sub-micron-sized dimensions. The sputter-resistant hardmask is retained over the adjacent non-recessed areas and is covered in a subsequent step by the electroplated blanket or overburden layer of metal, e.g., Cu or Cu-based alloy, filling the recesses. Planarization of the recess-filled dielectric layer surface, as by CMP, results in removal of the blanket or overburden layer of electroplated metal together with the underlying hardmask layer.

Cu and/or Cu-based alloy interconnect members formed in accordance with embodiments of the present invention can be, but are not limited to, interconnects formed by damascene technology. Thus, embodiments of the present invention include providing a substrate (e.g., a semiconductor wafer) having a dielectric layer thereon with a plurality of sub-micron-dimensioned, high aspect ratio recesses (i.e., damascene openings) formed in its exposed, upper surface according to the inventive methodology utilizing a sputter-resistant hardmask material, depositing a conductive adhesion promoting/diffusion barrier layer (e.g., TaN) and/or a thin, electrically conductive nucleation/seed layer (e.g., Cu or Cu alloy) lining the interior wall and mouth surfaces of the recesses and atop the non-recessed surfaces intermediate the recesses; filling the recesses with metal (e.g., Cu or Cu-based alloy) by electroplating; and planarizing the resultant upper surface by CMP, the planarizing step including removal of the remaining hardmask material over the non-recessed surface areas.

Given the present disclosure and the objectives of the invention, the electroplating parameters can be optimized for use in particular situations. For example, it was found suitable to employ a conventional $CuSO_4$ based bright copper plating bath (e.g., such as Enthone "M", available from Enthone OMI, New Haven, Conn.) at current densities of about 10 to about 30 $mA/cm^2$ and bath temperatures of about 20 to about 35° C. The substrate can be doped monocrystalline silicon or gallium arsenide. The dielectric layer(s) can comprise any of those conventionally employed in the manufacture of integrated circuit semiconductor devices, e.g., inorganic-based dielectric materials such as silicon oxides, silicon nitrides, and silicon oxynitrides, and low dielectric constant organic-based or derived materials such as hydrogen silsesquioxane (HSQ), benzocyclobutene (BCB), tetraethyl orthosilicate (TEOS), parylene, and polyimide.

Figure 3A:
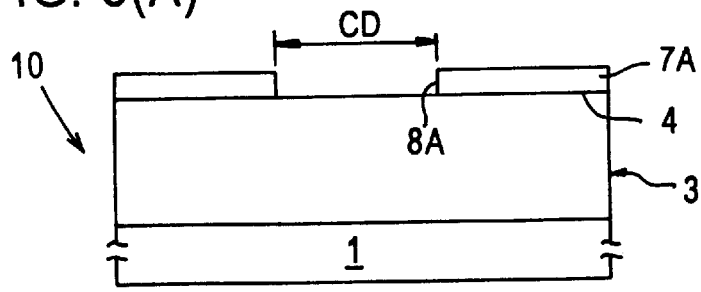
FIGS. 3(A)–3(E) illustrate, in simplified, cross-sectional schematic form, a sequence of steps for forming, filling, and planarizing a plurality of sub-micron-dimensioned recesses in a dielectric layer according to the methodology of the present invention.

An embodiment of the present invention will now be described with reference to FIGS. 3(A)–3(E). Referring initially to FIG. 3(A), schematically shown therein is a cross-sectional view of a workpiece 10 comprising a substrate 1, typically a semiconductor wafer having at least one active device region therein or thereon, and having a dielectric layer 3 formed thereon comprising at least one layer of a dielectric material such as are enumerated above, in which high aspect ratio openings or recesses 2 are to be formed in the surface 4 thereof according to the inventive methodology. As employed herein, the term "high aspect ratio" recess refers to an opening having a depth-to-width ratio of at least 2:1, and up to and including a ratio of about 5:1. For sub-micron dimensioned, high-density integration semiconductor devices employing multiple levels of metallization, e.g., up to 5 levels, such high aspect ratio openings may have a width of from about 1,500 to about 3,500 Å, e.g., about 3,000 Å, with a corresponding depth of from about 3,000 Å to about 1.75 μm.

Referring further to FIG. 3(A), in a first step according to the present invention, a layer 7A of sputter-resistant hardmask material about 200 to about 1,000 Å thick is formed, as by a conventional physical vapor deposition (PVD) or chemical vapor deposition (CVD) technique, over surface 4 of dielectric layer 3. A photoresist layer is then formed over the surface of the hardmask layer 7A and subjected to conventional photolithographic masking and etching techniques for forming therein a pattern of sub-micron-dimensioned openings corresponding to locations where recesses are to be formed in dielectric layer 3. The hardmask layer 7A is then selectively etched via the patterned photoresist, as by reactive ion etching (RIE) utilizing a first, fluorine-containing plasma, such as, for example, comprising $SF_6$, $CF_4$ or $CHF_3/O_2$, to form a patterned plurality of sub-micron-sized mask openings 8A, each having a critical dimension CD (only one such opening 8A being shown in the figure for illustrative simplicity). According to the inventive methodology, the hardmask material has a high etch selectivity with respect to the etch chemistry. Stated differently, the hardmask material is etchable by the first, fluorine-containing RIE plasma, but is resistant to sputtering when exposed to a second, fluorine-reactive ion etching (RIE) plasma, such as, for example, comprising $C_4F_8$, $CHF_3$ or $CH_2F_2$, utilized in a subsequent step for forming recesses or openings 2 in dielectric layer 3. Suitable materials for hardmask layer 7A include, but are not limited to, high atomic mass metallic elements, e.g., Ta, W, and Ti, and compounds thereof, such as, for example, their nitrides, i.e., TaN, WN, and TiN.

Figure 2A:
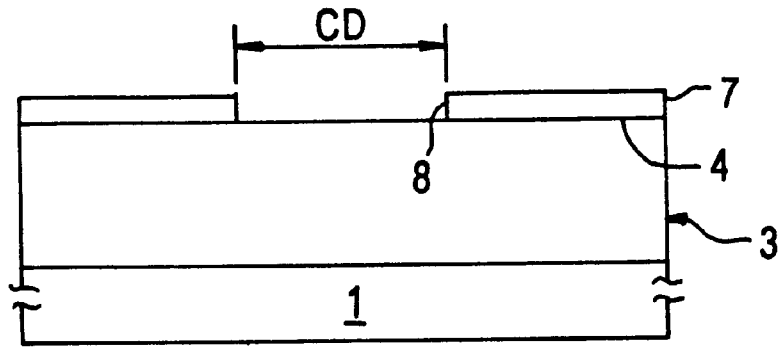
FIGS. 2(A)–2(C) illustrate, in simplified, cross-sectional schematic form, sequential initial, intermediate, and final phases of a conventional reactive ion etching process for forming sub-micron-dimensioned recesses in a dielectric layer, utilizing a silicon nitride hardmask.
Figure 2B:
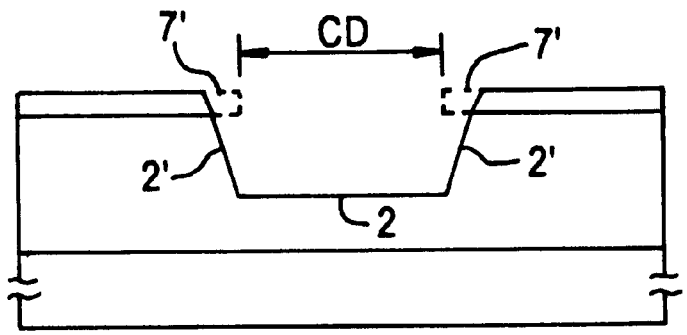
Figure 2C:
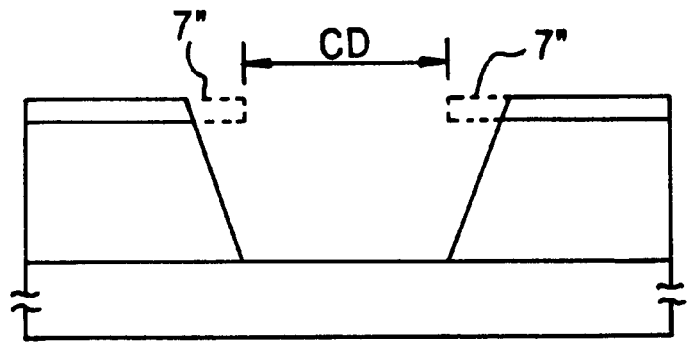
Figure 3B:
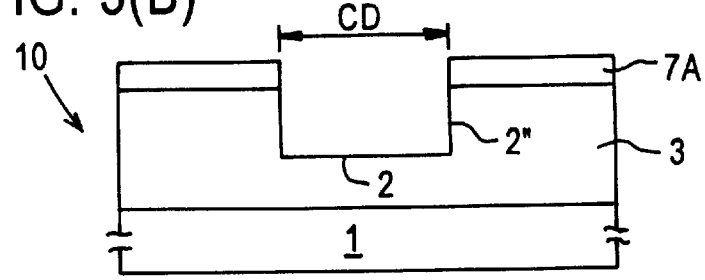
Figure 3C:
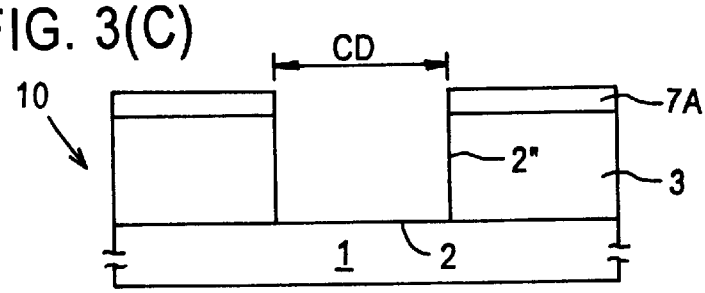

Referring now to FIGS. 3(B) and 3(C), shown therein are simplified, cross-sectional views analogous to those of FIGS. 2(B) and 2(C), respectively illustrating etch profiles obtained during intermediate and final stages of recess 2 formation in dielectric layer 3 by RIE utilizing a second, fluorine-containing plasma such as described supra, under conventional RIE conditions, e.g., at a RF power of from about 400 to about 2,000 W and pressures in the range of from about 5 to about 100 mTorr. As is evident from a comparison of FIGS. 2(B) and 3(B) and FIGS. 2(C) and 3(C), according to the inventive methodology, the critical dimension CD of sputter-resistant hardmask 7A is substantially maintained throughout RIE of dielectric layer 3 utilizing the second, fluorine-containing plasma. As a consequence, the sidewalls 2" of recess 2 are substantially vertical, and thus perpendicular to the surface of substrate 1, whereby critical sub-micron recess dimensions such as trench width or via hole diameter are obtained as determined by the original mask opening dimension, with little or substantially no width variation with depth.

Figure 3D:
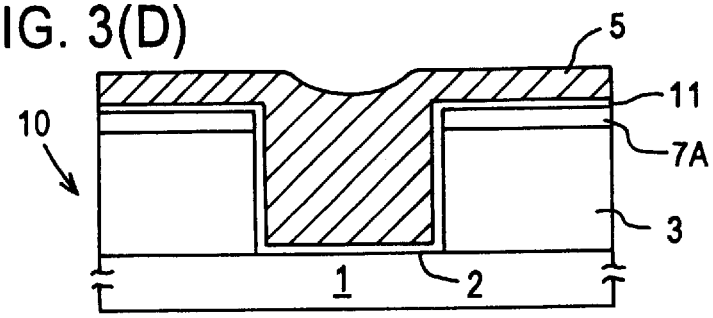

Adverting to FIG. 3(D), in a following step, and according to another feature of the inventive methodology, recess 2 is overfilled with a metal layer 5, e.g., by electroplating or other suitable technique, with mask layer 7A remaining in place. By way of illustration but not limitation, metal layer 5 may comprise electroless or electroplated Cu or a Cu-based alloy, in which instance a layer 11 comprising at least one of a diffusion barrier/adhesion layer about 100–400 Å thick and a nucleation/seed layer about 100–1,500 Å thick and comprising at least one material selected from chromium, tantalum, tantalum nitride, refractory metals, copper, and copper-containing alloys is deposited over at least the interior surfaces of recess 2 prior to filling with metal layer 5.

Figure 3E:
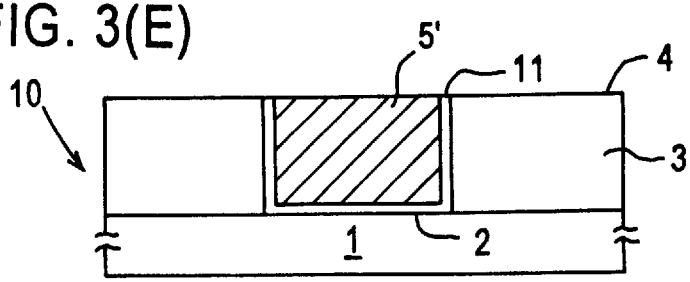

Referring now to FIG. 3(E), in a subsequent step, the thus-plated workpiece 10 is subjected to a process for planarizing the recess-filled plate surface, as by CMP utilizing an alumina-based slurry, similarly to the last step illustrated in FIG. 1. However, in a departure from the conventional methodology illustrated therein, the mask layer 7A utilized for forming recess 2 and retained in place during plating for filling the recess with layer 5 of conductive material, is removed by the CMP process together with the overburden portions of layer 5, thereby leaving electrically conductive plugs 5', e.g., of Cu or Cu-based alloy, filling recess 2, which plugs are co-planar with surface 4 of dielectric layer 3..

Thus, the present invention which utilizes a sputter-resistant masking material during recess formation in a dielectric layer by RIE enables the formation of extremely precisely dimensioned sub-micron-sized electrically conductive members and patterns, e.g., of copper or copper alloy, by providing a method for accurately forming and filling high aspect ratio recesses. The inventive process thereby effects a substantial reduction in time and cost of "back-end" damascene-type processing for forming in-laid metallization patterns. In addition, the inventive method is equally applicable for use in dual-damascene type processing.

The present invention is applicable to the formation of various types of in-laid metallization patterns, illustratively, but not limited to, copper and/or copper alloys. The present invention is particularly applicable to the manufacture of semiconductor devices having sub-micron dimensioned metallization features and high aspect ratio openings. The invention is also particularly well suited to the manufacture of circuit boards and other types of electronic devices and/or components.

In the previous description, numerous specific details are set forth, such as specific materials, structures, reactants, processes, etc., in order to provide a better understanding of the present invention. However, the present invention can be practiced without resorting to the details specifically set forth. In other instances, well known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of forming a layer of an electrically conductive material filling at least one high aspect ratio recess formed in a surface of a workpiece, which method comprises the sequential steps of:

providing a workpiece having a surface;

forming a sputter-resistant hardmask layer on said workpiece surface;

forming at least one opening in said hardmask layer, said opening having a position and a critical dimension (CD) corresponding to that of said at least one high aspect ratio recess to be formed in said workpiece surface;

forming said at least one high aspect ratio recess in said workpiece surface by a reactive ion etching process utilizing said hardmask layer for determining the position and dimensions of said at least one recess, said critical opening dimension of said hardmask remaining substantially constant during said reactive ion etching process;

filling said at least one recess with a layer of an electrically conductive material, said layer of electrically conductive material overfilling said at least one recess and forming a blanket layer covering the adjacent, non-recessed portions of said workpiece surface having said hardmask layer thereon; and planarizing the recess-filled surface to remove said blanket layer of electrically conductive material together with the underlying hardmask layer from said non-recessed portions of said workpiece surface.

2. The method as in claim 1, comprising providing a workpiece including a semiconductor wafer substrate with a dielectric layer formed thereon, said dielectric layer comprising said workpiece surface.

3. The method as in claim 2, further comprising forming said dielectric layer from a dielectric material selected from inorganic-based oxides, nitrides, and oxynitrides of silicon, or from an organic-based or derived low dielectric constant material selected from hydrogen silsesquioxane, tetraethyl orthosilicate, benzocyclobutene, parylene, and polyimide.

4. The method as in claim 1, comprising forming said sputter-resistant hardmask layer from a high atomic mass metallic element or nitride thereof selected from tantalum (Ta), tungsten (W), titanium (Ti), tantalum nitride (TaN), tungsten nitride (WN), and titanium nitride (TiN).

5. The method as in claim 1, comprising forming a plurality of spaced-apart openings in said hardmask layer, each having a position and a critical dimension corresponding to a high-aspect ratio recess to be formed in said workpiece surface.

6. The method as in claim 5, comprising forming said plurality of spaced-apart openings in said hardmask layer by photolithographic masking and etching of a photoresist material.

7. The method as in claim 1, comprising performing DC, RF, or directed beam reactive ion etching to form said at least one high aspect ratio recess in said workpiece surface.

8. The method as in claim 1, comprising filling said at least one recess with a layer of an electrically conductive material comprising a metal selected from Ti, Ta, W, aluminum (Al), chromium (Cr), nickel (Ni), cobalt (Co), silver (ag), gold (Au), copper (Cu), and their alloys.

9. The method as in claim 8, comprising filling said at least one recess with a layer of Cu or an alloy thereof.

10. The method as in claim 9, comprising depositing said layer of Cu or alloy thereof by electroless plating or electroplating.

11. The method as in claim 10, further comprising providing at least the interior surfaces of said at least one recess with at least one of an adhesion/barrier layer comprising a material selected from Cr, Ta, and TaN and a nucleation/seed layer comprising at least one material selected from refractory metals, Cu, and Cu-based alloys prior to depositing said layer of Cu or Cu-based alloy by electroless plating or electroplating.

12. The method as in claim 1, comprising planarizing the recess-filled surface of said workpiece by chemical-mechanical polishing.

13. The method as in claim 2, wherein said substrate comprises a semiconductor wafer of monocrystalline silicon (Si) or gallium arsenide (GaAs) having a surface, comprising forming said dielectric layer on said wafer surface, and said at least one recess formed therein comprises a plurality of recesses of different widths and depths for providing vias, interlevel metallization, and interconnection routing of at least one active device region or component of said semiconductor wafer.

14. A semiconductor device formed by the method of claim 13.

15. A method of manufacturing a semiconductor device, which method comprises the sequential steps of:

forming a dielectric layer on a surface of a semiconductor wafer substrate, said dielectric layer having an exposed surface;

forming a sputter-resistant hardmask layer on said exposed surface of said dielectric layer;

forming a plurality of spaced-apart openings in said hardmask layer, each of said plurality of openings having a position and a critical dimension corresponding to a high aspect ratio recess to be formed in said dielectric layer surface;

forming a plurality of spaced-apart, high aspect ratio recesses in the surface of said dielectric layer by reactive ion etching utilizing said hardmask layer for determining the positions and dimensions of said plurality of recesses, with non-recessed surface areas of said dielectric layer between adjacent recesses having said hardmask layer thereon, the critical dimension of each of said plurality of openings in said hardmask layer remaining substantially constant during said reactive etching;

filling said plurality of recesses with a layer of electrically conductive material by electroplating, said layer of electrically conductive material overfilling the plurality of recesses and forming a blanket layer covering said adjacent, non-recessed portions of said dielectric layer surface having said hardmask layer formed thereon; and planarizing the recess-filled surface to remove said blanket layer of electrically conductive material together with the underlying hardmask layer from said non-recessed portions of said dielectric layer surface.

16. The method as in claim 15, comprising providing a wafer of monocrystalline Si or GaAs having integrated circuitry formed therein or thereon; said dielectric layer comprises a dielectric material selected from inorganic-based oxides, nitrides, and oxynitrides of Si or from an organic-based or derived low dielectric constant material selected from hydrogen silsesquioxane, tetraethyl orthosilicate, benzocyclobutene, parylene, and polyimide; said sputter-resistant hardmask layer comprises a high atomic mass metallic element or nitride thereof selected from Ta, W, Ti, TaN, WN, and TiN; said plurality of recesses are of different widths and depths for providing vias, interlevel metallization, and/or interconnection routing of said integrated circuitry; and said layer of electrically conductive material filling said plurality of recesses comprises Cu or a Cu-based alloy.

17. The method as in claim 16, comprising forming said plurality of openings in said sputter-resistant hardmask layer by photolithographically masking and etching of an overlying photoresist layer; and said reactive ion etching for forming said plurality of high aspect ratio recesses in said dielectric layer surface comprises DC, RF, or directed beam reactive ion etching.

18. The method as in claim 16, further comprising providing at least the interior surfaces of said plurality of recesses with at least one of an adhesion/barrier layer comprising a material selected from Cr, Ta, and TaN and a nucleation/seed layer comprising at least one material selected from refractory metals, Cu, and Cu-based alloys prior to filling said recesses by electroplating a layer of Cu or Cu-based alloy.

19. The method as in claim 16, comprising planarizing the Cu or Cu-based alloy-filled recesses by chemical chemical-mechanical polishing utilizing an alumina-based slurry.

20. An integrated circuit semiconductor device fabricated by the method of claim 18.

* * * * *